United States Patent [19]

Tresselt

[11] 4,306,237
[45] Dec. 15, 1981

[54] PULSED SOLID STATE DEVICE HAVING A PREHEAT CIRCUIT TO IMPROVE PULSE SHAPE AND CHIRP

[75] Inventor: Carl P. Tresselt, Baltimore, Md.

[73] Assignee: The Bendix Corporation, Southfield, Mich.

[21] Appl. No.: 124,004

[22] Filed: Feb. 25, 1980

[51] Int. Cl.[3] ............................................. G01S 7/28
[52] U.S. Cl. ............................ 343/17.1 R; 343/5 DD; 343/17.1 PW
[58] Field of Search ...... 343/17.1 R, 5 DD, 17.1 PW

[56] References Cited

U.S. PATENT DOCUMENTS 3,458,817  7/1969  Cooper et al. ............. 343/17.1 R X
4,058,810 11/1977  Bryden ........................ 343/17.1 R
4,171,514 10/1979  Faxon ......................... 343/17.1 R X Primary Examiner—T. H. Tubbesing
Attorney, Agent, or Firm—W. G. Christoforo; Bruce L. Lamb

[57] ABSTRACT

A timing circuit (20, 22, 24) for use with a pulsed solid state radar generates signals which are applied to a pulse forming circuit (33) to provide preheat and immediately subsequent thereto current drive pulses applied to IMPATT diodes which in response thereto generate RF signal pulses (10, 12) having reduced chirp and level variations. The pulses are formed by transistors (70, 74) which are rendered conductive when their current return paths (28, 38) are established through resistors (34, 44) whose values determine the levels of the preheat and drive pulses.

The duration of the preheat pulse is made responsive to ambient temperatures by using a negative-temperature-coefficient thermistor (86) as the time determining element of the timing circuit. The level of the preheat pulse is made responsive to ambient temperature by using positive-temperature-coefficient silicon thermistors (34) in the above mentioned current return path.

11 Claims, 8 Drawing Figures

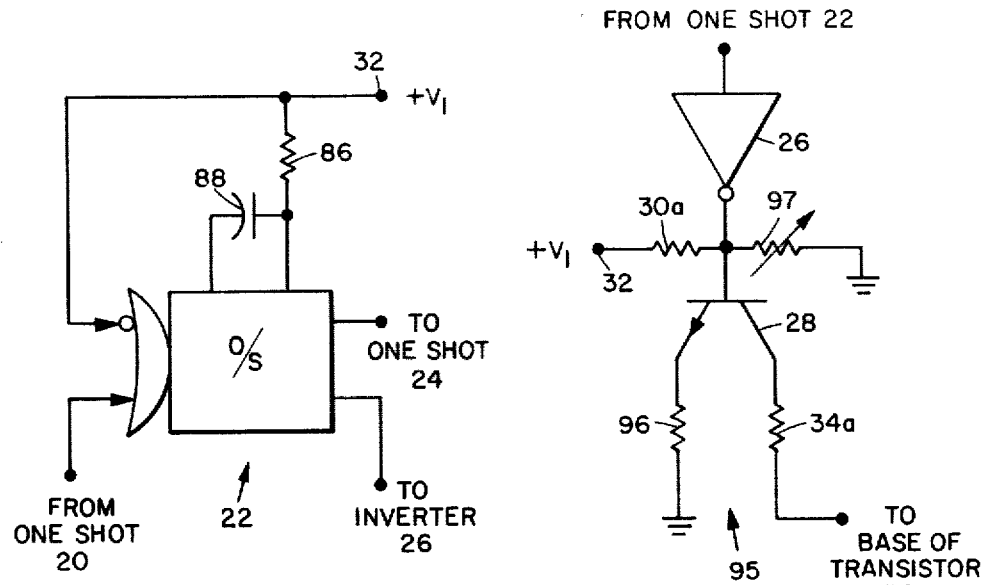
Fig.3
Fig.4
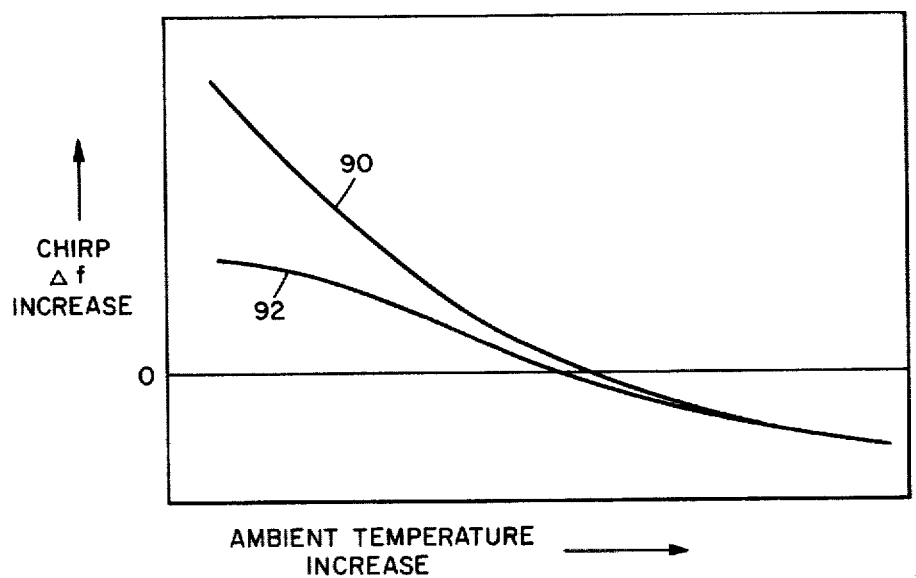
Fig.5

PULSED SOLID STATE DEVICE HAVING A PREHEAT CIRCUIT TO IMPROVE PULSE SHAPE AND CHIRP

This invention relates to pulsed solid state devices such as solid state radar transmitters and pertains particularly to such devices which include a circuit to preheat the solid state elements prior to application of the drive current.

Recent advances in solid state technology have lead to the availability of both CW and pulsed IMPATT diodes made of gallium arsenide which have superior DC to RF power conversion efficiency over more readily available silicon solid state devices. Unfortunately, the power output level of the gallium arsenide devices tends to be considerably more sensitive to temperature variations. In addition, under constant drive current conditions a device such as an oscillator using a gallium arsenide diode as its active element will typically produce a higher frequency output signal when operating at a cold junction temperature than when operating at a warmer junction temperature. Thus, the output frequency over the duration of the current drive pulse will decay, and the output power level will rise, as the junction temperature rises in response to junction heating induced by the current drive pulse. In the interpulse period the junction cools to some base temperature but is again heated by the subsequent current drive pulse. The resulting variation in frequency over the duration of the pulse is known as a chirp and is generally undesirable as is the upward variation in RF power level which occurs with junction heating. These problems are particularly severe when operating at cold ambient temperatures.

In the case of CW operation the variations in power level due to changes in ambient temperature can be mitigated by controlling drive current magnitude in an inverse manner with ambient temperature so that drive current is increased at low temperatures. The final power level achieved at the end of the pulse in pulsed-mode operation can also be made less variable over temperature according to the prior art by an inverse variation of "on" pulse current with temperature. However, in low duty cycle applications, the junction must still be heated from a cold initial temperature despite the additional pulse drive current supplied in cold ambients, giving rise to substantial power variation and chirp during each pulse.

One can advantageously preheat the diode by applying continuously up to about one-third of the normal pulse "on" current during RF "off" period, that is, between drive current pulses. In certain low duty cycle pulsed operation applications, however, such as use in airborne weather radar transmitters, a continuous current to preheat the diode is unacceptable as the power loss caused by such current is excessive and is generally several times the power used during the "on" time of the diode. In addition, although coherent RF output is not present during application of the preheat current, RF noise will be generated, thus tending to jam the sensitive receivers needed to work with presently achievable solid state transmitters.

According to the present invention the gallium arsenide diodes or other temperature sensitive active elements used in a pulsed solid state source are responsive to "on" drive current pulses for generating RF signal pulses, and have preheat current applied in the form of limited duration preheat pulses during the drive current pulses interpulse periods. More particularly, since the radar receiver must stay sensitive during at least the first portion of the interpulse period in order to respond to radar return echoes from targets illuminated by the RF signal pulses, it is preferred that the preheat pulses be generated only during the interpulse period subsequent to the time corresponding to the radar system maximum range. This scheme achieves the majority of the diode local junction heating desired prior to application of the transmitter normal "on" current while at the same time saving primary power and avoiding selfjamming of the radar receiver circuits during the time of maximum desired receiver sensitivity, that is, during the time the resulting desired radar return echoes are being received.

A further refinement can be obtained by controlling both the current level and/or the duration of the preheat pulses applied to the above mentioned active elements in accordance with the ambient temperature, whereby current level and duration are automatically increased as ambient temperature drops and current level and duration are automatically decreased as ambient temperature rises, within predetermined practical limits. This is accomplished in the preferred embodiment of this aspect of the invention by the use of positive and negative temperature coefficient thermistors in the pulse circuitry outlined above. This further improvement reduces "chirp" and lessens amplitude change within the RF signal pulse.

As will be explained below, the invention can be used to provide preheat for all the applicable temperature sensitive elements, for example, all the gallium arsenide diodes in a multiple diode cavity combiner of the prior art or to a single temperature sensitive element as well as to combinations of single and multiple element devices.

An advantage of the invention is that less primary power is used to preheat the temperature sensitive active elements of a pulsed solid state radar transmitter.

A further advantage of the invention is that the scheme used for preheat in the transmitter above will not cause selfjamming in a cooperating radar receiver.

Another advantage of the invention is that it permits the aforementioned preheat to respond to ambient temperature whereby "chirp" and amplitude variations within the transmitter generated RF signal pulses are greatly reduced.

BRIEF DESCRIPTION OF THE DRAWINGS

FIG. 3 illustrates a different form of the invention.

FIG. 4 illustrates another form of the invention.

FIG. 5 is a graph which illustrates the operation of the two forms of the invention.

DESCRIPTION OF THE PREFERRED EMBODIMENT

Figure 1:
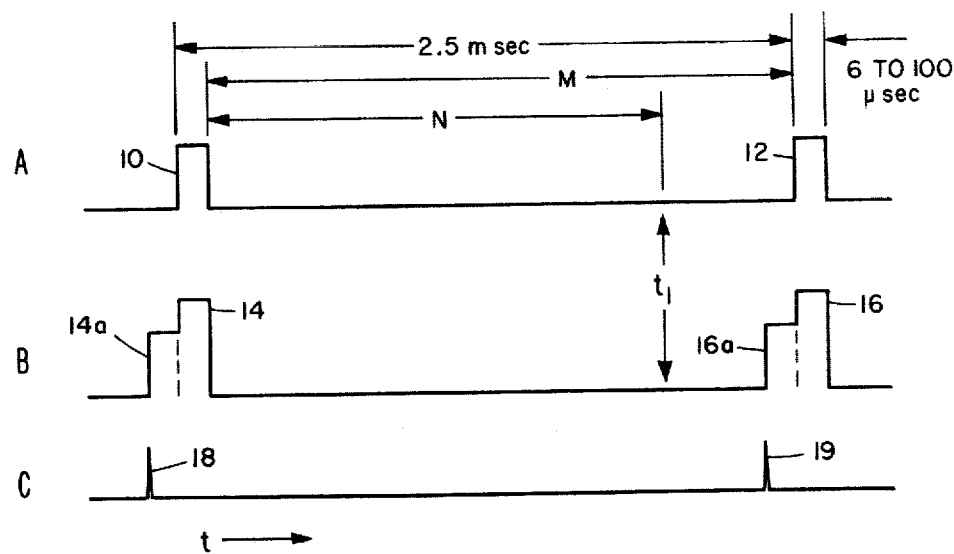
FIG. 1 illustrates the timing and various pulses of the preferred embodiment of the invention.

Refer first to FIG. 1 which shows at line A typical RF pulses 10 and 12 produced by a pulsed radar transmitter. As can be seen the typical pulse period is 2.5 milliseconds and the duration of a typical RF pulse is 100 microseconds, assuming that pulse compression technology is being employed to provide adequate range resolution. If pulse compression is not employed, a maximum duration of the pulse of 18 microseconds would be more typical. Radar return signals from a particular pulse, for example, pulse 10, can be expected during the subsequent interpulse period, here designated M. As well known, the time between the propagation of an RF pulse and the receipt of a signal echo of a target illuminated by that pulse is a measure of target range. There is normally a maximum range of interest. A typical range of interest is designated N and is measured by the time period extending from an RF pulse to a maximum range of interest, here equivalent to time $t_1$. During time period N it is, of course, required that the radar receiver be maintained in a state which is sensitive to radar echoes.

Line B of FIG. 1 shows the radar transmitter current drive or "on" pulses 14 and 16 which produce RF pulses 10 and 12 respectively. The current drive pulses coincide in time with the resulting RF pulses. Shown just prior to each current drive pulse is a current preheat pulse, for example, pulses 14a and 16a. In the present embodiment it is assumed that the current drive pulses 14 and 16 as well as the preheat pulses 14a and 16a are applied to IMPATT diodes connected in a cavity as a microwave oscillator. The amplitude of the various current pulses is set so that a drive current pulse, 14 or 16, is high enough to drive the IMPATT diodes into oscillation so that the respective RF pulses are generated while the preheat pulses 14a or 16a are of an amplitude just below the diode oscillation threshold so that no RF pulses are produced thereby. It will be noted that the preheat current pulses are generated in the interpulse period M but subsequent to time $t_1$, that is, outside the maximum range of interest. In this manner there will be no RF noise leakage from the diodes during preheat to self-jam the sensitive receiver circuits during receipt of radar echoes from targets within the range of interest.

In an actual radar, the above oscillator would be followed by a cavity amplifier in which the power of many IMPATT diodes is summed for transmission. Each IMPATT diode would be driven by a similar preheat pulse prior to the main current drive pulses which provide amplification in the diodes.

Figure 2:
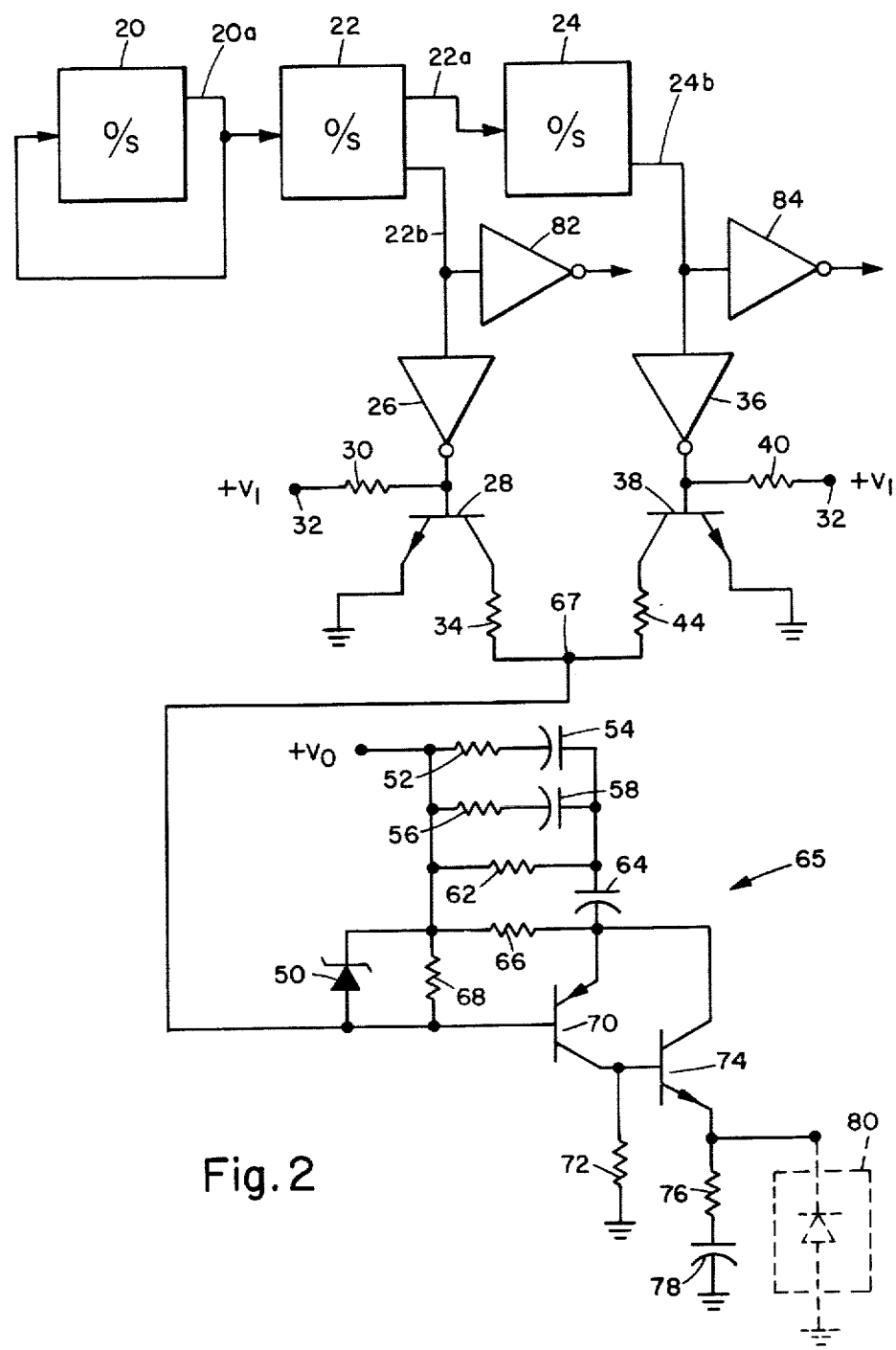
FIG. 2 is a modified block diagrammatic schematic of the invention.

Refer now to FIG. 2 which is a modified block diagrammatic schematic of the invention. In this embodiment the basic radar system timing is provided by the three one-shots 20, 22 and 24 where one-shot 20 is connected as an oscillator to produce a trigger pulse at output line 20a every 2.5 milliseconds, which is the radar system period. These trigger pulses are illustrated at line C of FIG. 1 as pulses 18 and 19. These pulses are applied via line 20a to the trigger terminal of one-shot 20 to retrigger that one-shot and also to the trigger terminal of one-shot 22 which has a period of 100 microseconds in this embodiment. This results in a 100 microsecond positive going pulse on output line 22a and an identical negative going pulse on output line 22b. These pulses can be associated in time with the preheat pulses 14a and 16a of FIG. 1. The trailing edge of the pulse on line 22a triggers one-shot 24 which in response produces a negative going pulse at line 24b. In this embodiment, the length of that latter pulse is also 100 microseconds and can be associated in time with the drive pulses 14 and 16 of FIG. 1.

The negative going pulse on line 22b is applied through open-collector inverter 26 to the base electrode of NPN transistor 28 which has its base electrode connected through resistor 30 to a $+V_1$ voltage terminal 32, its emitter electrode connected to ground and its collector terminal connected through resistor 34 to the input terminal 67 of the drive circuit 65. Input terminal 67 in this embodiment generally coincides with the base electrode of PNP transistor 70. During the duration of each pulse on line 22b transistor 28 is rendered conductive across its collector-emitter circuit so as to cause transistor 70 to conduct. In like manner, pulses on line 24b are applied through inverter 36 to the base electrode of NPN transistor 38 whose base electrode is connected to the $+V_1$ voltage terminal 32 through resistor 40, and whose emitter electrode is connected to ground and whose collector electrode is connected through resistor 44 to the base electrode of transistor 70. Thus, during the duration of each pulse on line 24b transistor 38 is rendered conductive across its emitter-collector circuit so as to cause transistor 70 to conduct.

Transistor 70, together with NPN transistor 74 form a somewhat conventional IMPATT diode drive current regulator which is here modified to conform to the requirements of the invention. The drive circuit includes a Zener diode 50 connected between a $+V_O$ voltage terminal and the base electrode of transistor 70, and a shunt reference resistor 68. A sensing resistor 66 is connected between the $+V_O$ voltage terminal and the emitter electrode of transistor 70, which is also directly connected to the collector electrode of transistor 74. A resistor 72 is connected between ground and the direct connection of the collector electrode of transistor 70 with the base electrode of transistor 74. The preheat and drive current pulses for the IMPATT diode circuit, here represented as box 80, are delivered at the emitter electrode of transistor 74. The emitter electrode of transistor 74 is connected to ground through the serial arrangement of resistor 76 with capacitor 78. The network serves to suppress low frequency IMPATT circuit bias oscillations.

In the drive current regulator comprised of transistors 70 and 74 the voltage across resistor 66 is forced to be equal to the voltage across resistor 68 whenever transistor 70 is conductive. In the circuit shown, additional RC elements have been placed across resistor 66, which provide an added amount of current to the IMPATT diode during the early portion of the drive pulse, speeding junction heating towards its steady state level. This technique, which is known in prior art, encompasses the serial arrangement of resistor 62 with capacitor 64, wherein the serial arrangements of resistor 52 with capacitor 54 and of resistor 56 with capacitor 58 individually shunt resistor 62.

Use of this current shaping technique was found to be most useful with CW gallium arsenide diodes used to produce the long 100 microsecond pulses of the present example. Fairly substantial chirp is produced by the sudden extra current heating at the front of the pulse, while chirp over the remainder of the pulse is substantially improved. However, in the case of driving pulsed-mode gallium arsenide IMPATT diodes, with shorter pulsewidths in the 6 to 18 microsecond region, the amount of extra chirp added by the current shaping technique was found to be unacceptable, and the technique was there deleted. In this latter case resistors 52, 56 and 62 and capacitors 54, 58 and 64 are removed from the circuit.

In normal operation, the appearance of a pulse at the base electrode of transistor 28 turns that transistor on to where its collector potential is near ground. Current accordingly flows out of the base of PNP transistor 70 through resistor 34. Since this pulse is associated with the preheat interval, the resistance of resistor 34 is chosen sufficiently high that the voltage drop across the current reference resistor 68 is a fraction of that present during the "on" drive interval. For example this voltage drop might be 1.5 volts, compared to an "on" drive potential of 6.2 volts, which is fixed by action of the Zener diode. When the drive pulse is initiated on the base of transistor 38, the collector of transistor 38, which is now near ground potential, draws sufficient current through the lower resistance of resistor 44 to assure the Zener diode does limit at 6.2 volts. These two potentials must be to the first order matched by the potentials appearing across resistor 66, through which flows the current fed to IMPATT 80. Accordingly, in this example, the preheat current will be 1.5/6.2 times the drive current level.

The prior art technique of increasing the "on" drive current with decreasing ambient temperature can be included in the present circuit. Resistor 44 would consist in this case of a combination of fixed resistance and, for example, a Sensistor positive-temperature coefficient silicon thermistor. This will increase the drive current reference potential across resistor 68 at reduced temperatures. (Sensistor is a trademark of Texas Instruments, Inc.) In this case the Zener voltage of diode 50 must be chosen sufficiently high so as now to limit only when the maximum acceptable IMPATT current has been reached, to prevent damage in the case of unusually cold ambient temperatures. Increasing the "on" drive current at cold ambient temperatures helps stabilize the pulse power applied to the IMPATT diode, which drive current ordinarily would decrease due to the lower IMPATT avalanche potential present when cold. Since Zener diode 50 will in this case no longer help stabilize the "on" current point at normally encountered temperatures, care must be taken to avoid storage time problems at the beginning of the drive pulse, when transistor 28 has just been ordered to switch to the off state.

Figures 7, 8:
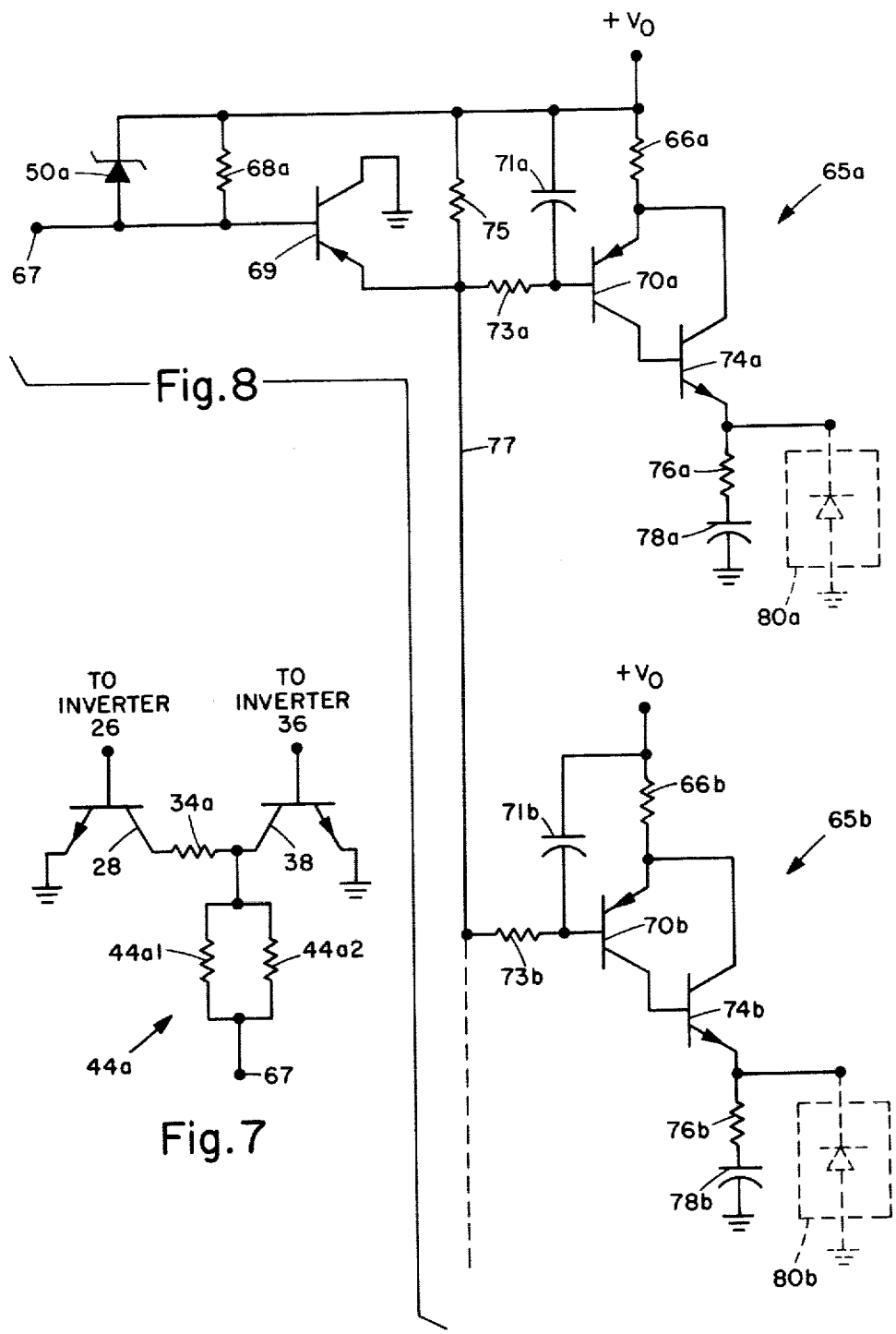
FIG. 7 illustrates a modification of the embodiment of the invention to avoid storage effects in certain transistors.
FIG. 8 is a schematic which illustrates how a plurality of IMPATT diodes can be controlled from a single bus.

One simple way to avoid storage effects in transistor 28 is shown by the modification of FIG. 7, reference to which should now be made. Here transistors 28 and 38 are seen as in FIG. 2 receiving output signals from inverters 26 and 36 respectively at their base electrode. In this case, however, a resistor 34a is connected between the collector electrodes and a resistor 44a is connected between the collector electrode of transistor 38 and terminal 67, which it will be remembered generally coincides with the base electrode of transistor 70 (not seen in this figure). Resistor 44a is preferably comprised of a fixed resistor 44a1 and a Sensistor 44a2. When the collector-emitter circuit of transistor 28 is rendered conductive by the signal from inverter 26, transistor 70 base current flows through that circuit and resistors 34a and 44a to ground. There is thus a desirable variation in transistor 70 base current with temperature due to Sensistor 44a2 in the resistor 44a path. When the collector-emitter circuit of transistor 38 is rendered conductive by the signal from inverter 36, transistor 70 base current flows through that circuit and resistor 44a to ground. Since the collector of transistor 38 is at that time near ground transistor 28 can take up to the full "on" drive current pulsewidth to recover from storage effects without affecting the level of "on" drive current. In this embodiment one current drive circuit comprised of transistor pair 70 and 74 is provided for each IMPATT diode. Generally, where a device for example an amplifier, is comprised of a number of IMPATT diodes, it is desirable that all be supplied current in accordance with a single reference resistor such as resistor 68 of FIG. 2. In that case, an emitter follower can be inserted after the reference resistor between terminal 67 and a bus 77, which controls various IMPATT diode drive circuits, for example, circuit 65a, 65b, as shown in FIG. 8, reference to which should now be made. The circuit of FIG. 8 is intended to replace the like circuit of FIG. 2 comprised of transistors 70, 74 and diode 50. Zener diode 50a is connected between the +V₀ voltage terminal and terminal 67, which is the same terminal 67 of FIGS. 2 and 7. Reference resistor 68a shunts the Zener diode. An emitter follower is comprised of PNP transistor 69, having its base electrode connected to terminal 67, its collector-electrode connected to ground and its emitter-electrode connected to bus 77, and a resistor 75 connected between the +V₀ terminal and bus 77. A plurality of IMPATT diodes, here exemplified by diodes 80a and 80b, are serviced by a plurality of drive circuits, for example, circuits 65a and 65b. The drive circuits are generally identical and, in the case of drive circuit 65b, is comprised of PNP transistor 70b having its base electrode connected to bus 77 through resistor 73b, its collector-electrode connected to the base electrode of NPN transistor 74b and its emitter-electrode connected through sensing resistor 66b to the +V₀ terminal and also to the collector-electrode of transistor 74b. The emitter-electrode of transistor 74b is connected to supply current to IMPATT diode 80b and also to ground through the serial arrangement of resistor 76b and capacitor 78b. A capacitor 71b is connected between the base electrode of transistor 70b and the +V₀ terminal to eliminate ringing due to the frequency response characteristic of the transistor pair 70b, 74b. The operation of circuit 65b is identical to the operation of circuit 65 of FIG. 2 and hence will not be further explained here. In a unit actually built it has been found possible to drive nine IMPATT diodes in a single amplifier cavity through the use of a single emitter-follower and nine circuits, such as circuit 65b, tied to the bus, such as bus 77.

Returning to FIG. 2, output lines 22b and 24b, can also be connected respectively through inverters 82 and 84 to circuits (not shown) such as those seen after inverters 26 and 36. Generally, the modification of FIG. 8 will be used to service multiple IMPATT diodes in a single device, such as multiple diodes in a single amplifier cavity, while the scheme described above with respect to inverters 82 and 84 is used to service another device such as a secondary cavity in an IMPATT amplifier chain.

It was found to be advantageous to vary the level of the preheat current pulses in accordance with ambient temperature. This was done in one version of the circuit actually built, referring to FIG. 2 by using three Texas Instruments 10 K ohm model TM ½ Sensistors in series in place of a fixed 27 K ohm resistor for resistor 34.

Resistance decreases in going cold, causing an increase in the current through reference resistor 68, and hence requiring an increase in current level through the IMPATT diode. This occurs whether the Zener diode 50 is present (for fixed "on" drive current) or not, as the Zener diode is essentially an open circuit at the reduced levels associated with preheat. If the variable "on" drive current scheme outlined previously is being employed, the use of a Sensistor in the resistor 34 branch can add usefully to preheat variation.

Refer now to FIG. 3 which shows one-shot 22 in greater detail. It will be remembered that this one-shot, and particularly the discharge circuit comprised of capacitor 88 and resistor 86, sets the duration of each preheat current pulse. In the embodiment of FIG. 2 when the preheat current pulse is 100 microseconds long capacitor 88 is 0.01 microfarads and resistor 86 is 33 K ohms. It has been found that the invention can be further improved so that IMPATT diode "chirp" is decreased by varying the duration of the preheat current pulse in accordance with ambient temperature so that a wider preheat current pulse is provided at colder ambient temperatures. This temperature responsive preheat current pulse can be obtained by changing the value of the resistance of resistor 86 in accordance with temperature. In a circuit actually built, rather than a single fixed resistor 86, resistor 86 took the form of a fixed 4.7 K ohm resistor in series with a 1 K ohm thermistor, model number KA31L1, manufactured by Fenwal Manufacturing Co. This produces a preheat current pulse which varied from a duration of 980 microseconds at −50° F. to 92 microseconds at 100° F. and above.

Consider an alternate circuit encompassing preheat circuit transistor 28 as shown in FIG. 4. Rather than serving as a simple pulse inverter, an emitter-resistor 96 has been added to the circuit, as well as a resistor 97 to ground from the base of transistor 28. By choice of resistance 30a and resistance 97, the transistor 28 can be biased in its linear operating range during the preheat interval. If in fact resistor 97 is a negative temperature thermistor such as the KA31L1, above a predetermined temperature $T_1$ transistor 28 will be biased off and preheat current will be essentially zero. Since at elevated temperatures, the need for preheat is small, particularly for pulsed-mode gallium arsenide IMPATT diodes, shut off of preheat provides a considerable prime power savings. Preheat is turned on over an interval in temperature below $T_1$ to the point where transistor 28 is fully conducting. In the actual circuit used, the turning on via bias of the transistor occupied about a 10° C. range. The values of range and $T_1$ can be varied by choice of the various bias resistors. Resistor 34a can be a Sensistor so that preheat current will continue to rise for temperatures below which transistor 28 reaches the fully on bias condition. The improvement in long RF pulse IMPATT performance, in the sense of reduction of chirp by making the preheat current pulses vary in accordance with ambient temperature, is seen in the graph of FIG. 5 where curve 90 plots chirp for a fixed preheat current pulse and curve 92 shows chirp using the thermistor in the one-shot timing circuit means for producing temperature responsive preheat current pulse duration, in conjunction with the Sensistor means for varying the preheat current.

Figure 6:
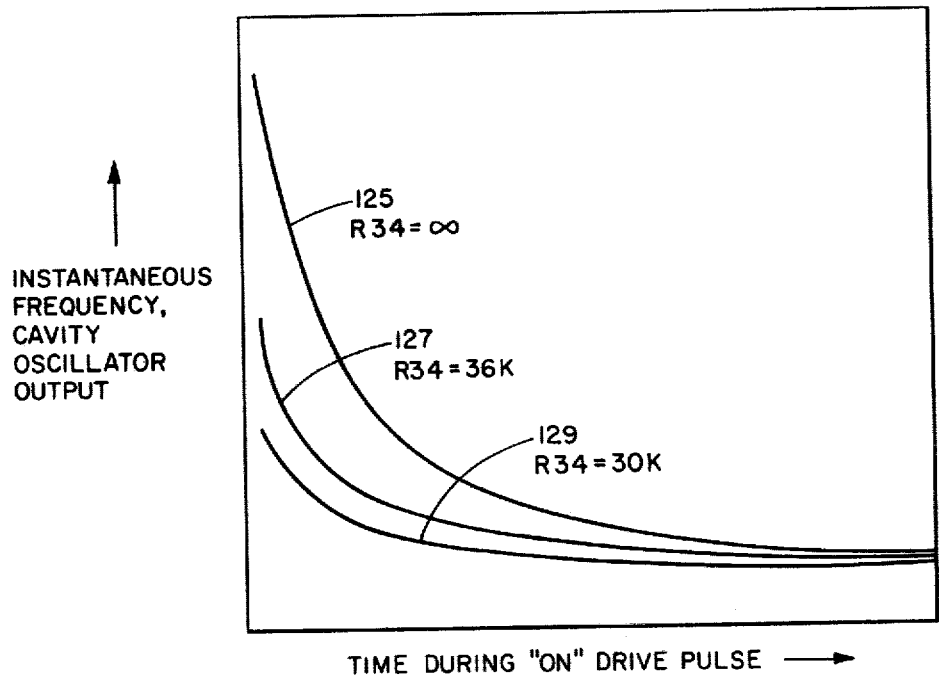
FIG. 6 is a graph which illustrates the chirp reduction provided by the invention at room temperature.

Refer now to FIG. 6 which shows curves of drive pulse "on" time versus instantaneous cavity oscillator output frequency for pulse mode gallium arsenide IMPATT diodes connected as oscillators. The various curves show how instantaneous frequency varies over the duration of a single "on" current drive pulse following a preheat pulse of fixed duration but of a different amplitude for each curve. Most specifically, the amplitude of a preheat pulse is inversely related to the resistance value of resistor 34 of FIG. 2. Where that resistance is infinity (curve 125), that is if resistor 34 is open circuited, there is no preheat pulse and frequency starts out high at the front end of the "on" current drive pulse and settles down as the IMPATT junction warms. As might be expected, the oscillator frequency is more constant during the duration of the "on" current drive pulse with increasing amplitude of the preheat pulse as illustrated by curves 127 and 129. Of course, there is a maximum permitted level of preheat pulse, that level being a level just below the turn on level of the IMPATT diode. As discussed earlier, if the IMPATT diode should turn on during preheat the resulting RF signal can self-jam the radar receiver.

Having described the above embodiments of my invention, various modifications and alterations thereof should now suggest themselves to one skilled in the art without departing from the spirit of the invention. Accordingly, I claim all that subject matter covered by the true spirit and scope of the appended claims.

The invention claimed is:

1. A pulsed radar system having solid state elements responsive to drive pulses for generating RF signal pulses, the drive pulse interpulse period being used to receive radar return echoes from targets illuminated by said RF signal pulses, the time of arrival of a particular radar return echo at the radar system after a particular RF signal pulse being a measure of range to the target producing said particular echo, characterized by means for generating and applying preheat pulses to at least some of said solid state elements during the drive pulse interpulse period and including level attenuation means for maintaining the level of said preheat pulses below the level of said drive pulses.

2. The pulsed radar system of claim 1 wherein the drive pulse interpulse period corresponds to a range greater than the maximum range of said radar system, and wherein said means for generating and applying preheat pulses includes means for applying said preheat pulses in said interpulse period subsequent to a time corresponding to said maximum range.

3. The pulsed radar system of claims 1 or 2 including means responsive to the ambient temperature in which said radar system is operating for varying the level of said preheat pulses.

4. The pulsed radar system of claim 3 wherein said means responsive to ambient temperature includes means for interrupting said preheat pulses above a predetermined ambient temperature.

5. The pulsed radar system of claims 1 or 2 including means responsive to the ambient temperature in which said radar system is operating for varying the width of said preheat pulses.

6. A pulsed radar system which periodically generates and transmits RF signal pulses and receives radar return echoes from targets illuminated by said RF signal pulses wherein the elapsed time from the transmission of a particular RF signal pulse to the receipt of a radar return echo from a particular target illuminated by said particular RF signal pulse is a measure of range to said particular target, and wherein said radar system has a maximum range of interest, and wherein said radar system includes means having IMPATT diodes responsive to current drive pulses for processing said RF signal pulses, comprising:

first timing means for periodically generating said current drive pulses;

second timing means for generating preheat pulses, each said preheat pulse being generated during the period between consecutive current drive pulses subsequent to a time corresponding to the maximum range of interest but prior to the next current drive pulse;

means for applying said preheat pulses to said IMPATT diodes; and, means for adjusting the levels of said current drive and preheat pulses so that the level of said preheat pulses is less than the level of said current drive pulses.

7. The pulsed radar system of claim 6 wherein said first and second timing means comprise a cascade of one-shots, said one-shots being connected so that one one-shot generates said preheat pulses and triggers another one-shot to generate said current drive pulses at the trailing edges of said preheat pulses.

8. The pulsed radar system of claim 6 or 7 including means responsive to ambient temperature for controlling the width of said preheat pulses.

9. The pulsed radar system of claim 12 wherein said means responsive to ambient temperature includes means for interrupting said preheat pulses above a predetermined ambient temperature.

10. The pulsed radar system of claim 6 or 7 including means responsive to ambient temperature for controlling the level of said preheat pulses whereby the level of said preheat pulses decreases as the ambient temperature rises.

11. The pulsed radar system of claim 10 wherein said means responsive to ambient temperature includes means for interrupting said preheat pulses above a predetermined ambient temperature.

* * * * *